(12) United States Patent
Gorrell et al.

(10) Patent No.: US 7,666,780 B2
(45) Date of Patent: Feb. 23, 2010

(54) ALIGNMENT VERIFICATION FOR C4NP SOLDER TRANSFER

(75) Inventors: Jerry A. Gorrell, Lagrangeville, NY (US); Sarah H. Knickerbocker, Hopewell Junction, NY (US); Srinivasa S. N. Reddy, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 11/954,828

(22) Filed: Dec. 12, 2007

(65) Prior Publication Data

US 2009/0181533 A1    Jul. 16, 2009

(51) Int. Cl.
*H01L 21/44* (2006.01)
(52) U.S. Cl. ............... 438/616; 438/612; 438/613; 438/615; 257/E21.508
(58) Field of Classification Search ........... 438/612, 438/613, 615, 616; 257/E21.508
See application file for complete search history.

(56) References Cited

U.S. PATENT DOCUMENTS 4,950,623 A    8/1990    Dishon

| | | | |
|---|---|---|---|
| 6,332,569 B1 * | 12/2001 | Cordes et al. | 228/254 |
| 6,940,168 B2 | 9/2005 | Garrity et al. | |
| 7,219,286 B2 | 5/2007 | Morgan | |
| 7,239,371 B2 | 7/2007 | Liegl et al. | |

* cited by examiner

*Primary Examiner*—A. Sefer
*Assistant Examiner*—Farid Khan
(74) *Attorney, Agent, or Firm*—DeLio & Peterson, LLC; Kelly M. Nowak; Joseph Petrokaitis

(57) ABSTRACT

A method is provided for the making of interconnect solder bumps on a wafer or other electronic device. The method is particularly useful for the well-known C4NP interconnect technology and determines if any off-set resulted between the solder mold array and the wafer capture array during the transfer process. The amount of off-set enables the operator to adjust the transfer tool before solder transfer to compensate for the off-set caused by the transfer process and provides a more cost-effective and efficient solder transfer process. A solder reactive material surrounding the capture pads is used to determine where the solder reacts with the solder reactive material showing the off-set resulting from the transfer process. Copper is a preferred solder reactive material.

9 Claims, 5 Drawing Sheets

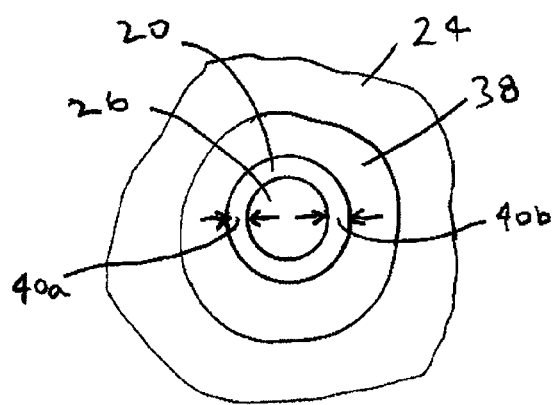
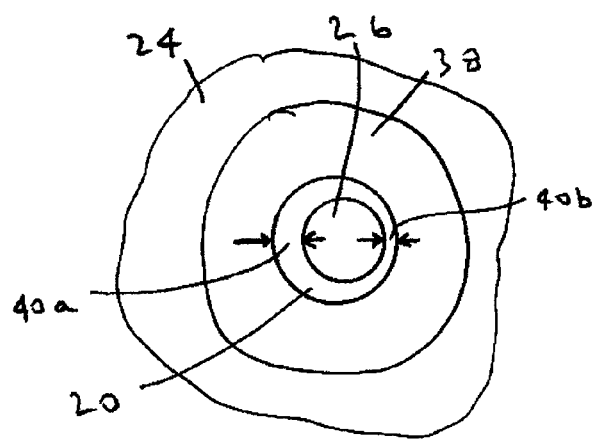
FIG. 3A          FIG. 3B
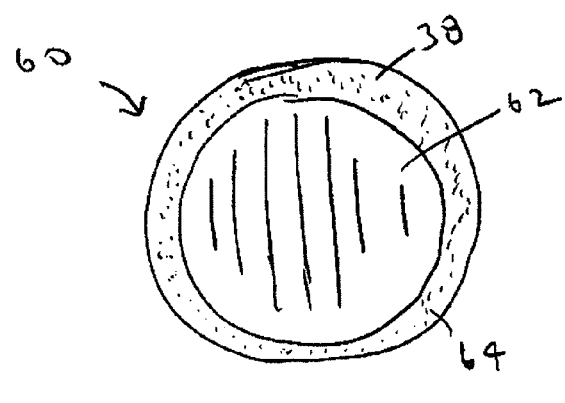
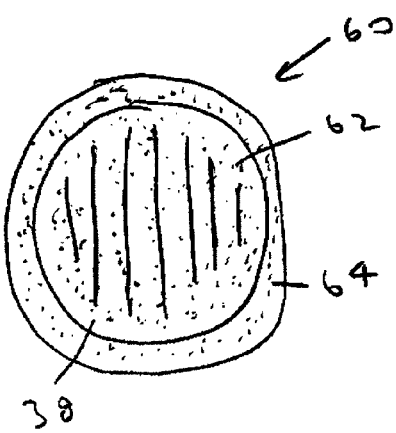
FIG. 6A          FIG. 6B

ALIGNMENT VERIFICATION FOR C4NP SOLDER TRANSFER

BACKGROUND OF THE INVENTION

1. Field of the Invention

The present invention relates to the making of interconnect solder bumps on a wafer or other electronic device, and, in particular, to verifying the alignment between a solder containing mold and the capture pads on a transfer wafer after the transfer of the solder in the mold to the capture pads using the C4NP interconnect technology.

2. Description of Related Art

Forming an electronic package assembly whereby an electrical component such as an integrated circuit chip is electrically and mechanically connected to a substrate, a card, or board, another chip or another electronic part is well known in the art. This technology is generally termed surface mount technology (SMT) and has gained acceptance as the preferred means of making electronic package assemblies. The interconnect technology is commonly known as ball grid array packaging, C4 flip chip interconnect, multi-chip modules, multilayer and micro via printed wiring boards and surface mount hybrid assembly.

Multilayer ceramic and organic electronic components are typically joined to other components by soldering (or capture) pads on a surface of one of the electronic components to corresponding soldering (or capture) pads on the surface of the other component. Control Collapse Chip Connection is an interconnect technology developed by IBM as an alternative to wirebonding. This technology is generally known as C4 technology or flip chip packaging. Broadly stated, an integrated circuit chip is mounted above a ceramic or organic substrate and pads on the chip are electrically and mechanically connected to corresponding pads on the substrate by a plurality of electrical connections such as solder bumps to form an electronically connected module. A module is typically connected to other electronic components by solder or socket type connections.

In the C4 interconnect technology a relatively small solder bump is attached to the pads on one of the components being joined, typically to the chip. The electrical and mechanical interconnects are then formed by positioning the corresponding pads on the substrate to be joined adjacent the solder bumps on the chip and reflowing the bumps at an elevated temperature. The C4 joining process is self-aligning in that the wetting action of the solder will align the chip bump pattern to the corresponding pads on the substrate. Capture pads can also be sputtered and subsequently etched without any plating.

Capture pads for C4 bumps on semiconductor wafers or on the substrate to be interconnected are well-known and are typically made by a through resist plating of Ni or Cu/Ni pads onto a Cu seed layer. It is also preferred to use a conductive barrier layer on the substrate surface and the Cu seed layer is preferably made by sputtering of Cu onto a sputtered TiW layer.

In C4 technology the solder bumps are formed directly on the capture pads of the one unit. The pads are electrically isolated from other pads by the insulating chip passivation and substrate that surrounds each pad. The substrate may be un-doped silicon (Si) or some other material. The bottom of the pad is electrically connected into the chip or substrate circuit.

A major application of C4 is in joining semiconductor microchips (integrated circuits) to chip packages. Chips usually are made in rectangular arrays on a mono-crystalline slab of silicon called a "wafer," which is a thin disc several inches across. Many chips are formed on each wafer, and then the wafer is diced into individual chips and the chips are "packaged" in units large enough to be handled. The C4 bumps are placed on the chips while they are still joined in a wafer.

One method of forming solder bumps uses sputtering or vacuum deposition. Solder metal is evaporated in a vacuum chamber and the metal vapor coats everything in the chamber with a thin film of the evaporated metal. To form solder bumps on the substrate, the vapor is allowed to pass through holes in a metal mask held over the substrate. The solder vapor passing through the holes condenses onto the cool surface into solder bumps. This method requires a high vacuum chamber to hold the substrate, mask, and flash evaporator.

An alternative technique for making solder bumps is electrodeposition, also called electrochemical plating or electroplating. This method also uses a mask such as patterned photoresist and forms solder bumps only at the selected sites. Other methods include screening a solder paste through a mask and depositing micro-bumps in place.

The C4NP transfer process is the preferred method and uses a mold containing the solder and transfers the solder in the mold to the capture pad of the wafer and upon heating forms solder bumps on the wafer pads. The mold solder bumps are preferably filled with solder by an Injection Molding Solder (IMS) method as described below.

C4NP solder transfer is a process by which solder in the cavities of glass molds is transferred to capture pads on wafer surfaces. In this process, a solder filled mold is aligned to a wafer and the two are placed in close proximity of each other. A seal ring around the outside of the wafer creates a confinement chamber in which nitrogen is injected during heating and cooling. After the wafer/mold are heated above the melting temperature of the solder, the two are placed in contact with each other. The molten solder wets the surface of the capture pads on the wafer and the solder "sticks" to the wafer. The wafer and mold are pulled apart from each other, leaving the solder behind on the wafer capture pads. In order to create a wettable surface on the capture pad, a flux is typically used. Flux is also used on the mold filled solder to make it free from oxides as well. Upon cool down, the chamber is opened and the wafer with solder bumps and the empty mold are removed from the tool.

It is critically important when performing C4NP solder transfer that the mold and the wafer be precisely aligned to each other. The capture pad on the wafer is typically about 100 μm in diameter and the solder in the mold is typically about 150 μm in diameter. If these are misaligned, then bridges between C4's or missing C4's are seen and a yield loss is realized. The solder transfer tool allows the operator to align the mold to the wafer within a few microns. However, during the ramping up of the temperature and the motion that occurs when moving a wafer and mold into contact as well as aberrations in the optic system, some distortion from this ideal is seen. The amount of movement from the ideal location at alignment and the final location upon contact can be as much as 100 μm or more in any one direction and it is important to know how much movement from the "perfectly aligned" position as seen with the camera occurs and the direction that it moves. If a wafer has a 150 micron pitch between capture pads, a misalignment of more than about 30 μm in any direction, can be disastrous. Therefore it is critically important to know the misalignment resulting from the transfer process and how much off-set is required in the original alignment to compensate for the process induced misalignment. The following invention provides a method to determine the alignment off-set with each wafer run. There are no solutions to this problem to the best of our knowledge.

Bearing in mind the deficiencies of the prior art it is an object of the present invention to improve the mold solder transfer to wafer capture pad process and, in particular, the method for the transfer of the solder in the mold to the corresponding capture pad of the wafer substrate in the C4NP process.

It is another object of the invention to provide a method for determining the amount of off-set between the solder in the mold and the corresponding capture pads on the wafer resulting from the transfer process to enable proper positioning of the transfer tool for subsequent solder transfer procedures using the transfer tool.

Still other objects and advantages of the invention will in part be obvious and will in part be apparent from the specification.

SUMMARY OF THE INVENTION

The above and other objects, which will be apparent to those skilled in the art, are achieved in the present invention which is directed to a method for forming solder bumps on an electronic substrate surface comprising the steps of:

providing a solder transfer mold having a plurality of solder mold openings in an array, which mold openings are filled with solder;

providing an electronic substrate containing pads in an array to which pads the solder in the mold is to be transferred, the mold array corresponding to the substrate pad array and the substrate having an inactive area having one or more inactive pads;

depositing a material around the periphery of the one or more inactive pads, which material reacts with molten solder;

positioning the solder containing openings of the mold proximate the surface or pads of the electronic substrate to which the solder is to be transferred;

providing a seal around the mold and the electronic substrate and forming a chamber;

heating the chamber to an elevated temperature preferably sufficient to liquefy the solder and preferably under an inert atmosphere;

preferably passing a reducing gas into the chamber contacting the mold and the electronic substrate to remove oxides from the mold solder and electronic substrate surfaces and removing the gas after passing through the chamber;

transferring the solder from the mold openings to the corresponding pad array on the electronic substrate surface by bringing the solder mold and electronic substrate into transfer contact and forming an empty mold;

removing the seal from the mold and removing the empty mold from the electronic substrate leaving the electronic substrate with the solder from the mold openings on the pad surfaces thereof, and examining the one or more inactive pads of the electronic substrate and measuring the material which reacted with the molten solder to determine if any alignment off-set resulted from the solder transfer.

In another aspect of the invention a method is provided for forming solder bumps on an electronic substrate surface comprising the steps of:

providing a solder transfer mold having a plurality of solder mold openings in an array, which mold openings are filled with solder;

providing an electronic substrate containing pads in an array to which pads the solder in the mold is to be transferred, the mold array corresponding to the substrate pad array;

positioning the solder containing openings of the mold proximate the surface or pads of the electronic substrate to which the solder is to be transferred;

providing a seal around the mold and the electronic substrate and forming a chamber;

heating the chamber to an elevated temperature preferably sufficient to liquefy the solder and preferably under an inert atmosphere;

depositing a material on the substrate surface, which material reacts with molten solder;

preferably passing a reducing gas into the chamber contacting the mold and the electronic substrate to remove oxides from the mold solder and electronic substrate surfaces and removing the gas after passing through the chamber;

transferring the solder from the mold openings to the corresponding array on the electronic substrate surface by bringing the solder mold and electronic substrate into transfer contact and forming an empty mold;

removing the seal from around the mold and removing the empty mold from the electronic substrate leaving the electronic substrate with the solder from the mold openings on the surface thereof, and examining the pads of the electronic substrate and measuring the material which reacted with the molten solder to determine if any alignment off-set resulted from the solder transfer.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 3A-3B are plan views of a solder filled mold overlying a capture pad with the mold and capture pad being aligned after solder transfer in FIG. 3A and the mold and capture pad misaligned after solder transfer in FIG. 3B.

FIG. 6A shows a plan view of a wafer having an inactive area around the periphery thereof with a solder reactive material on the inactive area.

FIG. 6B shows a plan view of a wafer having an inactive area around the periphery thereof with the whole wafer having a solder reactive material on the surface thereof.

DESCRIPTION OF THE PREFERRED EMBODIMENT(S)

In describing the preferred embodiment of the present invention, reference will be made herein to FIGS. 1-8 of the drawings in which like numerals refer to like features of the invention.

Various solders may be readily processed using the method of the invention and these include lead and lead-free binary, ternary and quaternary alloys. Lead-free alloys are of particular commercial significance and for convenience the following description will be directed to such lead-free alloys although it will be appreciated by those skilled in the art that any suitable solder may be readily processed using the method of the invention. Exemplary lead-free alloys include Sn-1.8% Ag, Sn-0.5% Ag and Sn-0.7% Cu. Also, in particular, the following description will be directed to tin containing lead-free alloys since these are likewise of significant commercial interest and an efficient method of providing solder interconnects with these alloys is of important commercial consideration.

Figure 1:
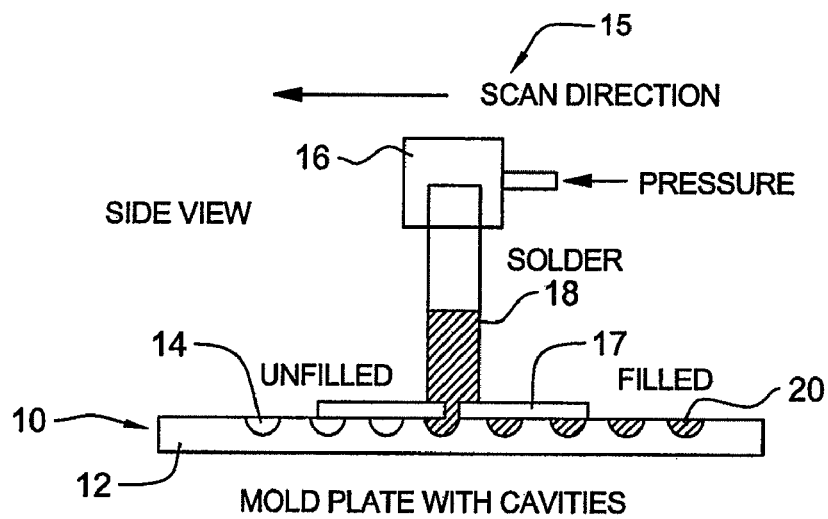
FIG. 1 is a schematic diagram showing filling of the mold plate with solder using injection molding.

IMS is the preferred method to make mold plates containing cavities which are filled with solder and a preferred transfer device for use in the method is shown in FIG. 1. FIG. 1 shows a mold 10 comprising a mold substrate 12 having solder openings or cavities 14. An IMS apparatus shown generally as 15 comprises an injection device 16 containing molten solder 18 therein. In operation, the IMS apparatus 16 is filled with molten solder 18 and moves in relation to the cavity containing mold plate 12, both of which are usually above solder liquidus temperature. As the apparatus scans across the mold plate in the direction of the arrow, the solder 18 from the reservoir, under constant pressure, passes through a dispensing slot 17 and into the solder openings 14 filling the openings to form solder filled openings 20. After the scanning process, the mold plate 12 is cooled to solidify the solder. It is then inspected, which can be done using various automated optical techniques. After inspection, the mold plates may be either immediately sent for transfer of the solder to the wafer or other substrate or stored in a non-oxidizing environment.

The mold plates can be made from a variety of materials and is typically glass. Since transfer of the solder from the mold plate to the final solder receiving substrate, such as the wafer, occurs at elevated temperatures, matching the coefficient of thermal expansion (CTE) of the mold plate and substrate is important. This is especially true as the area to be transferred increases. Thus, for a single chip, or even a 4 inch diameter wafer, the smaller distance to a neutral point is such that the mold and substrate can tolerate some CTE mismatch and yet still works successfully. However, for larger areas such as 8 inch and 12 inch diameter wafers it is important that the mold material closely match the CTE of the wafer substrate, i.e., silicon.

Cavities (the solder openings) 14 in the mold plate are in a pattern and are the mirror image of the solder receiving pads on the final substrate or wafer. The cavities can be produced in a mold plate by any number of techniques, the selection of which is dependent upon the cavity size and pitch as well as the mold plate material. Cavity volume uniformity is essential since they directly determine the solder bump volume on the wafer.

The above method as shown in FIG. 1 to make a mold plate filled with solder is well-known in the art and is not a part of this invention other than to provide the solder filled mold plate which is then used to transfer the solder from the mold plate to the capture pads of the wafer or other substrate.

Figure 2A:
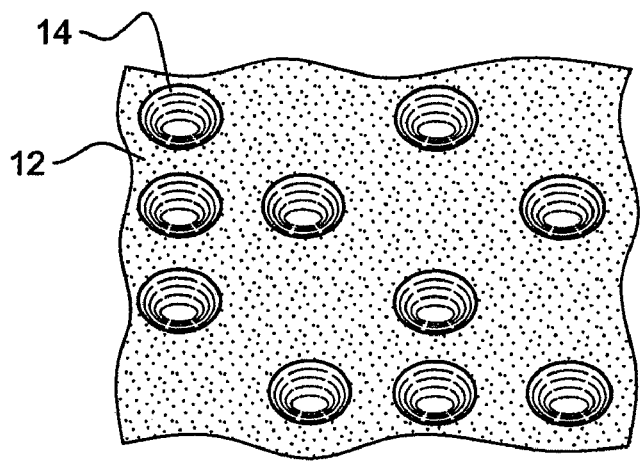
FIG. 2A is a plan view of a portion of a mold plate showing the mold cavities.

FIG. 2A shows a portion of a mold plate 12 having a number of cavities 14 therein.

Figure 2B:
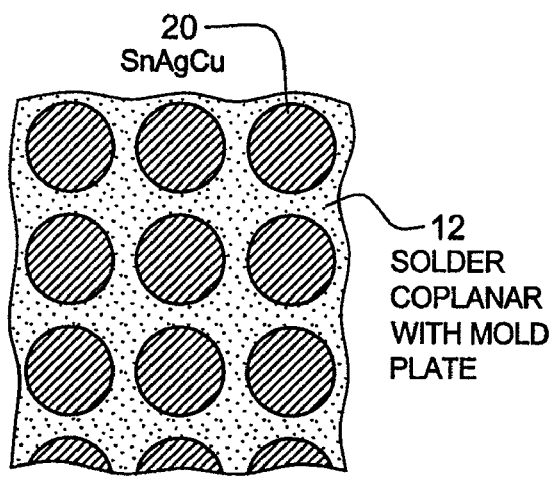
FIG. 2B is a plan view of the mold plate of FIG. 2A with the mold cavities filled with solder.

FIG. 2B shows a portion of a mold plate 12 which openings are filled with solder forming solder filled openings 20. The surface of the solder is coplanar with the mold plate.

Figure 2C:
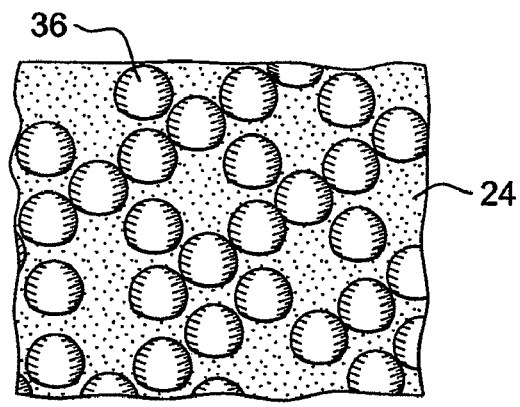
FIG. 2C is a top view of an electronic substrate containing the solder transferred from the mold to the surface thereof.

FIG. 2C shows the transfer of the solder from the mold plate to the wafer 24, the transferred solder 36 being in the inverted form of the solder which was in the mold cavities. A preferred solder shape is spherical.

Alignment of the mold and the transfer substrate, i.e., wafer, is critical to the success of the mold to wafer transfer. When transparent mold plates are used, it is relatively easy to align solder filled cavities to wafer pads. When non-transparent material is used, or when a gaseous flux is used, alignment using split optics may be necessary. Depending upon the environment of the transfer, flux may or may not be used. If used, it can be applied in a thin even coat onto the filled mold plate or wafer before proceeding to the transfer fixture. Or it can be applied in the vapor phase at or near the solder transfer temperature. If not used, oxide reducing methods such as pressure variation, formic acid or hydrogen reflow can help to facilitate the transfer. In general, when the solder in the mold plate is in a liquidus state and the wafer pads are oxide free, the solder wetting forces exceeds surface tension forces that maintain the molten solder in their cavities. While the solder is liquid, the solder bumps are released from the mold plate onto the wafer pads and the mold plate is lifted from the wafer. The shape of the bumps on the wafer tend to be spherical, especially if the capture pad on which they are transferred is round. The wafer can now be independently subjected to a final solder reflow excursion after wafer test to obtain spherically shaped bumps on the wafer pads if test damage makes this necessary.

The present invention is directed to improving the above transfer process particularly with regard to the initial alignment of the array of the solder in the mold to the corresponding pad array on the electronic substrate to compensate for off-set resulting from the transfer process. Determination of the amount of off-set during the transfer process enables the operator to align the mold and wafer before the transfer process to compensate for off-set movement resulting from the transfer process.

Figure 7:
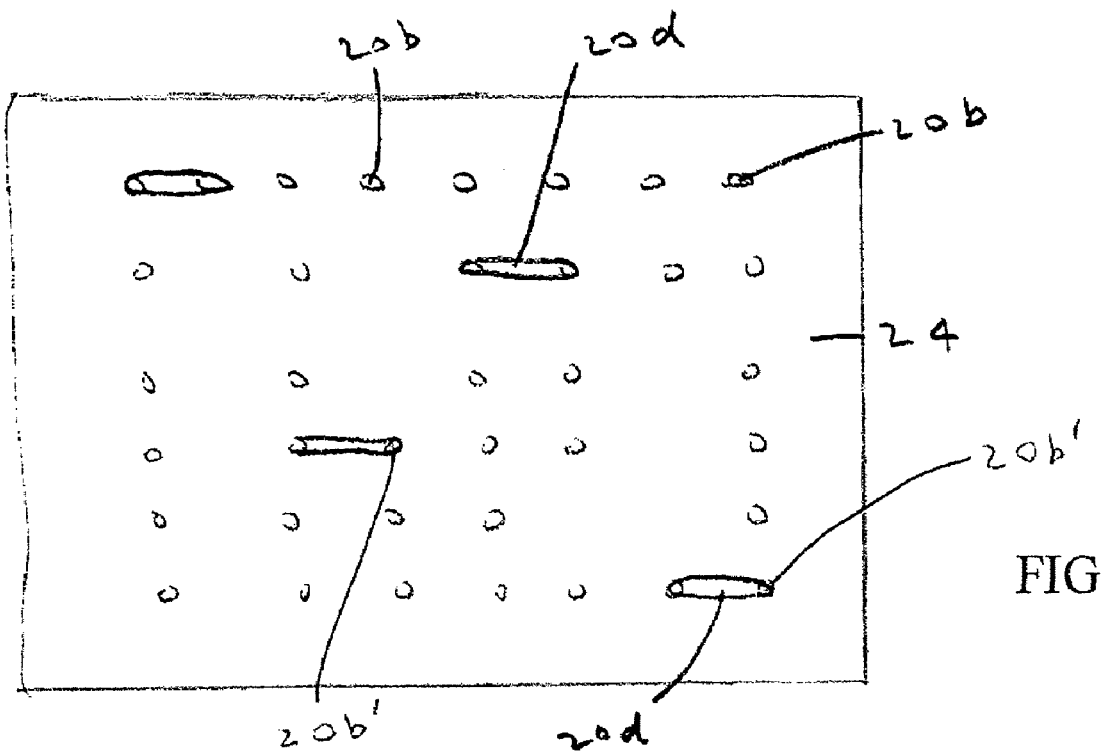
FIG. 7 shows a plan view of a wafer showing solder bumps between some of the capture pads resulting from misalignment of the mold and wafer during the solder transfer process as shown in FIGS. 5A-5D.

In one aspect of the invention, in order to determine the alignment off-set, material which reacts with molten solder is deposited around the periphery of one or more inactive pads on the wafer. The material is preferably suspended in a liquid when deposited on the wafer and the liquid evaporates leaving the material on the wafer surface which reacts with the solder. In one embodiment, a drop of fine grained copper powder in isopropyl alcohol is placed on a wafer in the inactive area such as the wafer edge or kerf area. The copper powder/isopropanol drop deposits a thin layer of copper particles on the wafer as the isopropyl alcohol evaporates. When solder is transferred from the mold onto the wafer, any area of the wafer surface that is contacted with the solder reacts with the copper powder and leaves behind a copper-free area. Observing this copper-free area after the transfer indicates where the solder from the mold first made contact with the wafer and the accuracy of the initial alignment can be determined. After solder contact on the wafer, the solder typically wets the capture pad and centers itself on that pad unless the off-set is great enough to form a solder bridge between adjacent pads as shown in FIG. 7.

Using the above method, only a small area of the wafer gets the copper deposit and, in particular, the kerf or inactive area. Consequently no active chips are damaged by this technique. Also, the copper does not damage the wafer in any way since it does not diffuse either in the vapor phase or the solid phase to any other areas of the wafer.

In another aspect of the invention, a solder reactive material is deposited over the entire wafer. In one embodiment just prior to the contact of the solder to the capture pad, a reducing gas is fed into the confinement chamber, e.g., formic acid with some oxygen or air and Sn solder micro-spheres are formed and deposited onto the wafer. When the solder contacts the wafer, this Sn area is "cleaned" of the micro-spheres, making it possible to observe the degree of off-set from the ideal alignment as described above. In another embodiment, the reactive material may be formed over the entire wafer surface before the wafer is placed in the transfer chamber.

The use of a solder reactive material in the inactive areas of the chip is preferred because it is non-destructive to any of the active chips. In the preferred embodiment, copper powder of approximately 1 micron in diameter is mixed with a liquid such as isopropyl alcohol and deposited on the desired area. The copper or the solder reactive material may be present in varying amounts and is generally about 50 wt % but can be much more or much less. Preferably a single drop is deposited on the wafer edge at several positions along the perimeter among the inactive or dummy C4 capture pads. The isopropyl alcohol quickly evaporates, leaving behind only the copper powder. The copper powder sufficiently adheres to the wafer surface. Other liquids such as methanol, ethanol, water, and the like may be used but isopropyl alcohol is preferred because of its demonstrated effectiveness.

Other solder reactive materials other than copper can be used and the particle size may vary widely. Metal powders are preferred because most will not volatilize and redeposit elsewhere on the wafer. Organic materials may also be used. Inorganic powders such as $SiO_2$ and $Al_2O_3$ may also be used. In general inorganic oxide powders do not volatilize, however, they also do not tend to sufficiently react with the solder. Consequently, when the solder comes in contact with the inorganic powders, the solder can physically move the powders which can show some indication of solder contact which may be suitable for some transfer operations. Other metal powders can potentially be used but should not be reactive with the capture pads preventing solder transfer. Metals such as Ni powder, Ag, Au, and other similar metals may be used.

In the aspect of the invention wherein the entire wafer is coated with a reactive material, one technique injects air into the transfer chamber. The oxygen in the air acts to oxidize the solder in the mold as well as the wafer surface. Sn or other solder material micro-spheres are formed and deposit on the wafer surface prior to solder contact. In another method air can be locally injected into the confinement chamber so that only localized areas of the wafer have tin micro-spheres on the wafer surface. The reactive material may also be formed over the entire wafer surface before being placed in the transfer chamber or any point before the solder transfer step.

Areas of the wafer with tin micro-spheres can be inspected using either a visual inspection or an optical tool. Gases other than air may also be used such as oxygen/inert gas mixtures.

Referring to FIGS. 3A and 3B, plan views are provided of a solder containing mold opening overlying a capture pad. The mold and wafer will always be aligned before solder transfer unless an off-set compensation is used according to the method of the invention.

In FIG. 3A the solder filled mold opening 20 and capture pad 26 are aligned. In FIG. 3B the mold opening 20 and capture pad 26 are shown unaligned. Solder reactive material 38 underlies solder filled mold opening 20 and is present around the periphery of capture pad 26. In FIG. 3A 40a is equal to 40b showing no misalignment during the transfer process. 40a and 40b are the areas of solder reactive material 38 reacted with the solder with the remainder of material 38 not reacting with the solder. During the transfer process however, the mold opening 20 and capture pad 26 may become unaligned as shown in FIG. 3B. It is this non-alignment caused by the transfer process that is the subject of the present invention which enables an operator after performing the transfer process to determine the extent of off-set or misalignment and adjust the initial alignment of the transfer process accordingly to compensate for the misalignment resulting from the transfer process. Thus, in FIG. 3B, 40a and 40b are not equal showing misalignment.

Figure 4A:
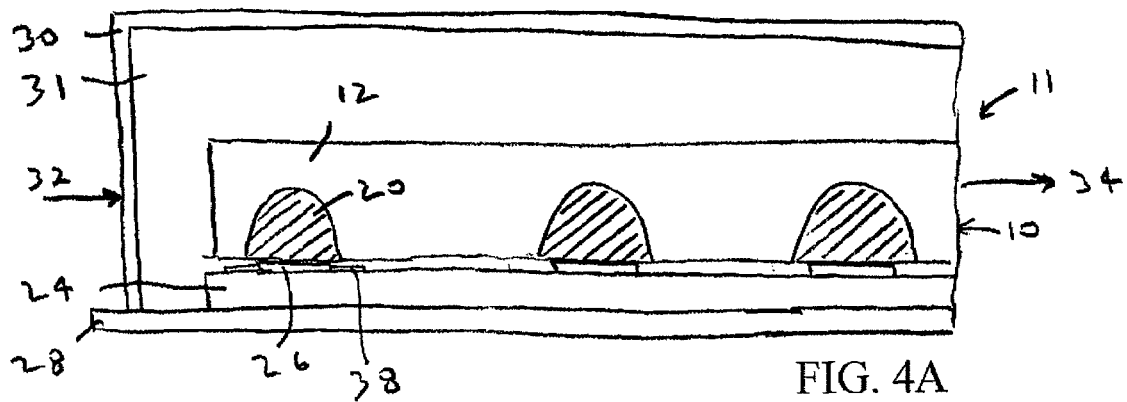
FIGS. 4A-4C are elevational, cross-sectional views of the C4NP process of the invention where the mold and capture pads are aligned before and after solder transfer.

In FIG. 4A, a filled mold (containing the solder) 10 comprising a mold substrate 12 and solder filled cavities 20 and a wafer 24 are loaded into a solder transfer tool 11. The mold and wafer are brought into near contact. Typically the diameter of the solder filled cavity is about 50% greater than the diameter of the capture pad, e.g., 150 microns versus 100 microns.

The solder transfer tool 11 comprises a base 28 on which the wafer substrate 24 is positioned. The mold 12 is positioned above the wafer substrate 24 having capture pads 26 thereon. The capture pads are in an array corresponding to an array in the mold. As shown in FIG. 4A, a temperature resistant seal ring 30 forms a confinement chamber 31 in which gases are injected through inlet 32 and removed by outlet 34. During heat up to an elevated temperature, e.g., 280° C., flowing nitrogen in the chamber prevents oxidation of the solder or the capture pads of the wafer. A reducing gas, such as a mixture of formic acid and nitrogen, is then injected into the heated chamber creating a reducing environment. The elevated temperature is sufficient to liquefy the solder, and is preferably about 5 to 60° C. above the melting point of the solder. Any non-oxidizing gas may be used. The formic acid "cleans up" the solder, removing oxide, and also cleans the capture pad surface. After sufficient formic acid flow as determined by the amount of oxide on the wafer or solder surface, the non-oxidizing gas flow is maintained during the transfer process. The solder and wafer are brought together in FIG. 4B so that the solder 20 preferably contacts the capture pads 26 and the solder wets the capture pads and the solder is transferred from the mold to the wafer pad. Typically, the solder wets and flows down all capture pad sides and the solder then on cool down forms a bump on the pad surface. The mold does not have to contact the wafer surface but this is preferred from an operations standpoint. Prior to cool down, the wafer and seal are pulled away in FIG. 4C, leaving behind a solder bump 20b, in the shape of a sphere, on each capture pad 26 of the wafer 24. The C4NP process can also be practiced with the wafer 24 on top facing downward and the mold 12 on the bottom facing upward.

The scale of the components shown are for clarity. Typically the height of the captive pad 26 is less than 5 microns and the height of the solder is greater than 60 microns.

Figure 4B:
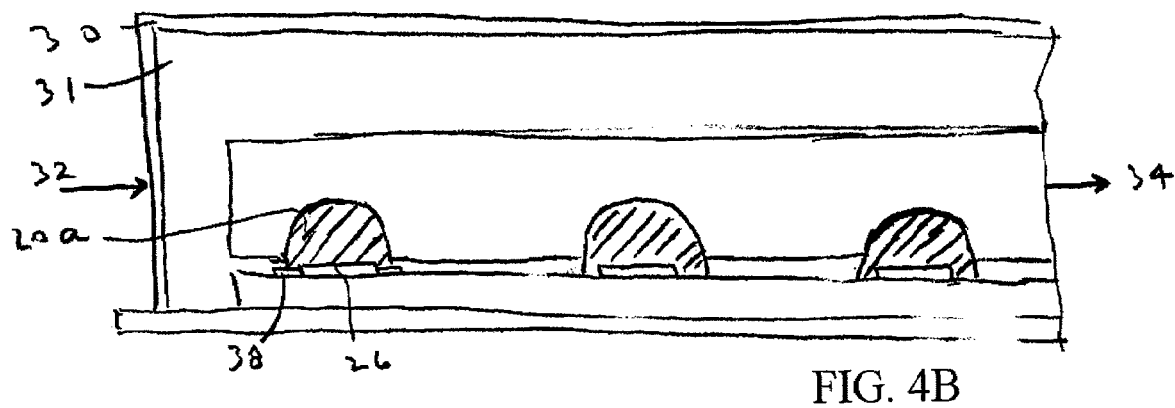
Figure 4C:
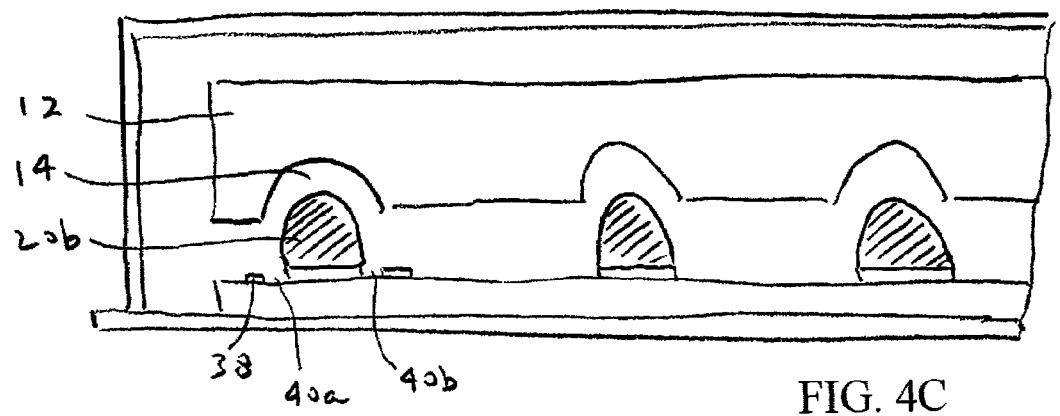

Referring again to FIGS. 4A-4C, these figures show proper alignment of the mold and capture pad at the start of the transfer operation and no misalignment resulting from the transfer process. Accordingly, in FIG. 4A, a material 38 which reacts with the molten solder is shown deposited on the surface of substrate 24 around the periphery of capture pad 26. In FIG. 4B the solder is now molten and flows forming the solder mass 20a which is shown equally covering capture pad 26 and material 38. The molten solder 20a reacts with the material 38 where it contacts the material 38 forming openings 40a and 40b free from material 38 on the wafer surface as shown in FIG. 4C. The solder has solidified and formed a bump 20b on the surface of capture pad 26.

Examination of the wafer 24 and material 38 in FIG. 4C shows that the wafer and mold were not misaligned during the transfer process since areas 40a and 40b (now absent of reactive material 38) are about the same showing to the operator that molten solder contacted the capture pad 26 in the center of the capture pad and that the molten solder was evenly distributed around the periphery of the capture pad. This can be seen in FIG. 3A above which is a partial plan view of the wafer of FIG. 4C. Areas 40a and 40b are about the same and symmetrical around pad 26. The remaining solder reactive material 38 not reacted is shown on the surface of wafer 24.

Figure 5A:
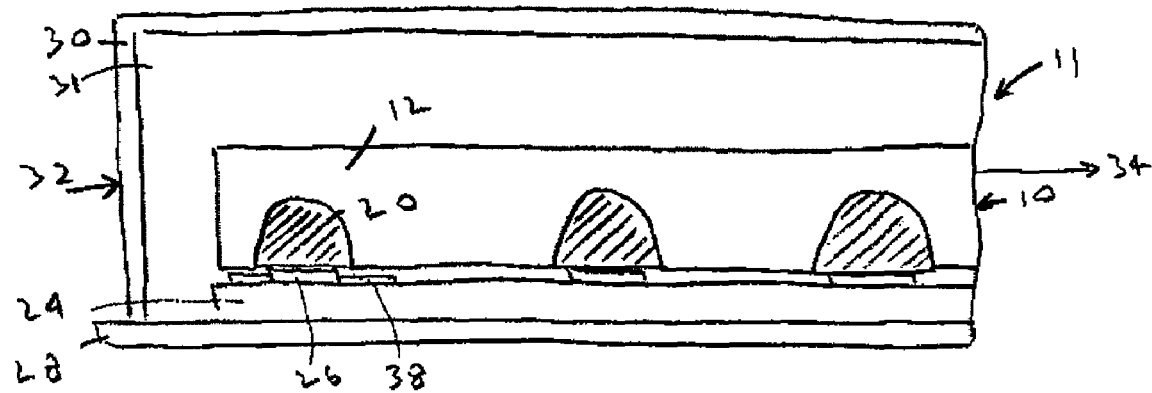
FIGS. 5A-5D are elevational, cross-sectional views of the C4NP process of the invention where the mold and capture pads are aligned before solder transfer and misaligned after solder transfer.
Figure 5B:
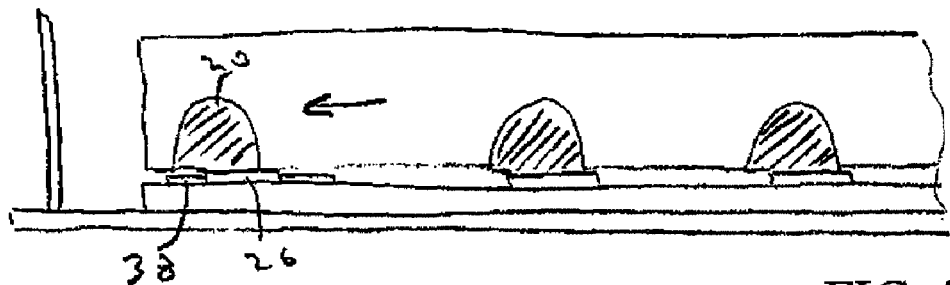
Figure 5C:
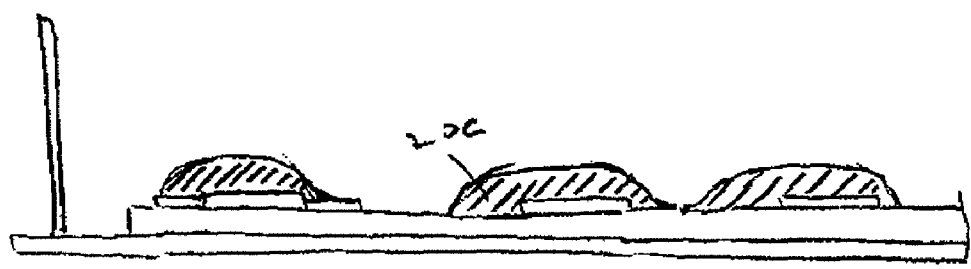
Figure 5D:
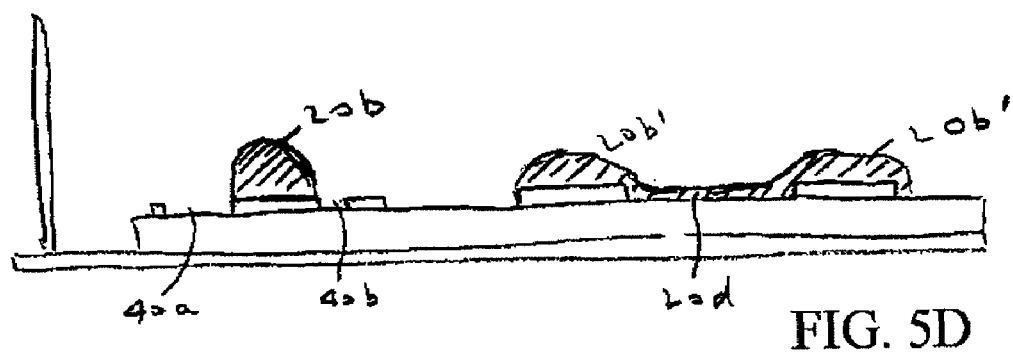

The above transfer process which had no misalignment during the transfer process is to be contrasted with FIGS. 5A-5C which show misalignment of the mold openings and capture pads resulting from the transfer process. Thus, in FIG. 5A the mold 12 and opening 20 are perfectly aligned with capture pad 26 of substrate 24. In FIG. 5B during the transfer process the mold 12 was moved to the left as shown by the arrow so that the center of mold opening 20 is now off-set from capture pad 26. In FIG. 5C when the solder 20 is melted, its contact area is skewed to one side of the capture pad 26 as numeral 20c although the solder will typically also run down all sides of the contact pad. In FIG. 5D it can be seen that the solder reactive material is removed more from area 40a than from area 40b, surrounding pad 26 indicating that there was misalignment of the mold and capture pad during the transfer process. See FIG. 3B. Using this information the operator would position the mold in FIG. 5A to the right of the pad 26a (in the opposite direction of the arrow) a distance of approximately half of 40a to compensate for the off-set caused by the transfer process. This can be seen in FIG. 3B whereby 40a is greater than 40b.

For the pads in the active areas of the wafer 12, if the misalignment is severe enough, then the solder flowing between the pads shown as number 20c, solidifies and forms a bridge between the pads (numeral 20d). See FIG. 5D. Note that the solder bumps 20b' are lower than solder bumps 20b showing the effect of the bridging. If the misalignment causes the solder to not contact the capture pad the solder contacts the wafer substrate between the capture pads and no transfer to the wafer occurs because the solder does not wet the wafer substrate leaving the solder behind in the mold. This is a severe case of misalignment.

It will be clear to a person skilled in the art that there may be varying degrees of off-set produced during the transfer process but that this can be readily determined by the method of the invention so that the alignment at the start of the transfer process can be adjusted to compensate for the measured off-set.

Referring now to FIG. 6A, a plan view of a wafer 60 is shown having an active area 62 and a peripheral inactive area 64. The solder reactive material 38 is shown deposited only in the inactive area 64. In FIG. 6B the wafer of FIG. 6A is shown having an active area 62 and an inactive area 64 but with the solder reactive material covering the whole wafer. In this aspect of the invention where the whole wafer is covered with a solder reactive material, the transfer process alignment off-set measurement would be determined using the same techniques as discussed above except that any of the pads on the wafer can be measured to determine the extent of the off-set. Techniques for depositing the solder reactive material over the entire wafer are described above and, preferably, for tin containing solders, a reactive gas is used in the transfer chamber to form tin micro spheres which coat the surface of the wafer before the transfer process is started. For example, during the initial flow of the reducing gas into the chamber, air or an oxygen containing gas is internally leaked into the chamber for, e.g., 5 seconds, resulting in the deposition of Sn microspheres on the wafer.

FIG. 7 shows the result of misalignment on the wafer as demonstrated in FIGS. 5A-5D. Thus, the solder bump 20b' in the inactive areas is of unacceptable height due to its decreased height from bridging (20d) as well as being an electrical short, causing a defective chip.

Figure 8:
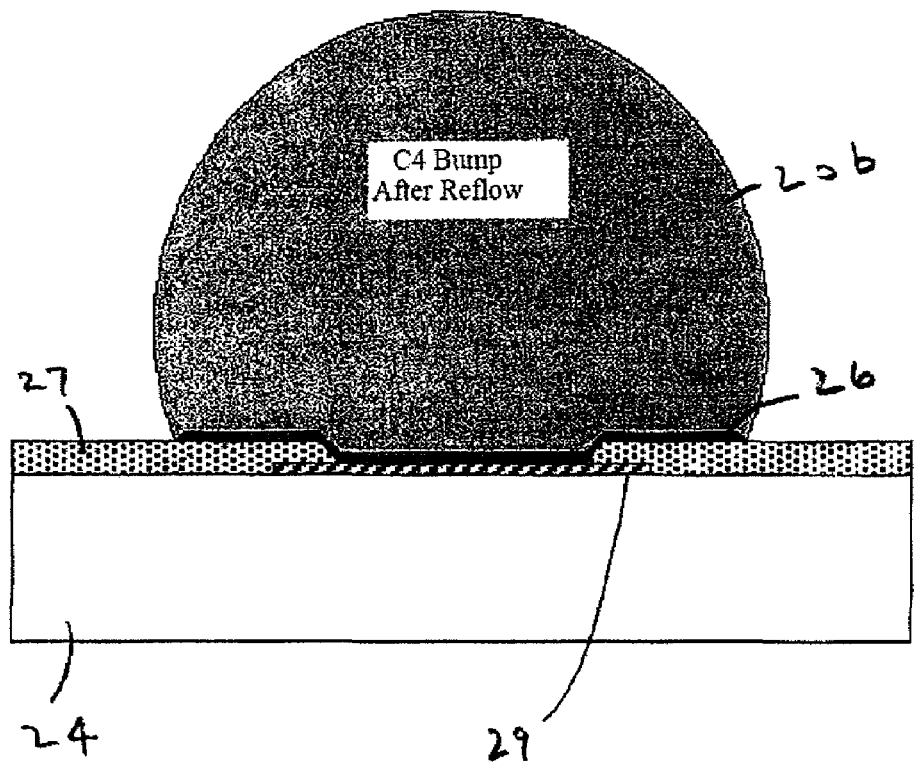
FIG. 8 shows an elevational view of a typical reflowed solder bump on a wafer capture pad.

FIG. 8 is a typical solder bump 20b formed on a wafer 24 after reflow and shows the capture pad 26, passivation layer 27 and final metal surface 29 between the wafer substrate 24 and capture pad 26.

The improved C4NP process of this invention is applicable to pad layers such as TiW/Ni, TiW/Co, TiW/Cu/NiP, TiW/NiV, TiW/NiV/Cu, TiW/NiSi, TiW/NiSi/Cu, TiW/NiAu, TiW/CrCu/Ni/Cu and other Ni, Au and Cu alloys that are compatible with the solder C4s. Further, while the above description describes the mold above the electronic substrate during transfer, for some methods the mold may be positioned below the electronic substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming solder bumps on an electronic substrate surface comprising the steps of:

providing a solder transfer mold having a plurality of solder mold openings in an array, which mold openings are filled with solder;

providing an electronic substrate containing pads in an array to which pads the solder in the mold is to be transferred, the mold array corresponding to the substrate pad array and the substrate having an inactive area having one or more inactive pads;

depositing a material around the periphery of the one or more inactive pads, which material reacts with molten solder;

positioning the solder containing openings of the mold proximate the surface or pads of the electronic substrate to which the solder is to be transferred;

providing a seal around the mold and the electronic substrate and forming a chamber;

heating the chamber to an elevated temperature to liquefy the solder;

transferring the solder from the mold openings to the corresponding pad array on the electronic substrate surface by bringing the solder mold and electronic substrate into transfer contact and forming an empty mold;

removing the seal from the around the mold and removing the empty mold from the electronic substrate leaving the electronic substrate with the solder from the mold openings on the pad surfaces thereof; and examining the one or more inactive pads of the electronic substrate and measuring the material which reacted with the molten solder to determine if any alignment off-set resulted from the solder transfer.

2. The method of claim 1 wherein the solder is a tin containing lead-free alloy.

3. The method of claim 1 wherein the material deposited is suspended in a liquid, which liquid evaporates after deposited on the electronic substrate.

4. The method of claim 3 wherein the material is copper powder suspended in isopropyl alcohol.

5. The method of claim 3 wherein the material is a metal powder.

6. A method is provided for forming solder bumps on an electronic substrate surface comprising the steps of:

provecting a solder transfer mold having a plurality of solder mold openings in an array, which mold openings are filled with solder;

providing an electronic substrate containing pads in an array to which pads the solder in the mold is to be transferred, the mold array corresponding to the substrate pad array;

positioning the solder containing openings of the mold proximate the surface or pads of the electronic substrate to which the solder is to be transferred;

providing a seal around the mold and the electronic substrate and forming a chamber;

heating the chamber to an elevated temperature to liquefy the solder;

depositing a material on the substrate surface, which material reacts with molten solder;

transferring the solder from the mold openings to the corresponding array on the electronic substrate surface by bringing the solder mold and electronic substrate into transfer contact and forming an empty mold;

removing the seal from the around the mold and removing the empty mold from the electronic substrate leaving the electronic substrate with the solder from the mold openings on the surface thereof; and examining the pads of the electronic substrate and measuring the material which reacted with the molten solder to determine of any alignment off-set resulted from the solder transfer.

7. The method of claim 6 wherein the solder is a tin containing lead-free alloy.

8. The method of claim 7 wherein during an initial flow of reducing gas, air or an oxygen containing gas is intentionally leaked into the chamber resulting in the deposition of Sn microspheres on the electronic substrate.

9. The method of claim 6 wherein the material is deposited over the entire electronic substrate surface before the substrate is placed in the chamber.

* * * * *